(12) United States Patent
Endoh

(10) Patent No.: US 8,872,162 B2
(45) Date of Patent: Oct. 28, 2014

(54) FIELD-EFFECT TRANSISTOR AND METHOD FOR MANUFACTURING THE SAME

(75) Inventor: Hiroyuki Endoh, Tokyo (JP)

(73) Assignee: NEC Corporation, Tokyo (JP)

( * ) Notice: Subject to any disclaimer, the term of this patent is extended or adjusted under 35 U.S.C. 154(b) by 257 days.

(21) Appl. No.: 13/583,549

(22) PCT Filed: Mar. 9, 2011

(86) PCT No.: PCT/JP2011/055495
§ 371 (c)(1),
(2), (4) Date: Sep. 7, 2012

(87) PCT Pub. No.: WO2011/111736
PCT Pub. Date: Sep. 15, 2011

(65) Prior Publication Data
US 2013/0037781 A1 Feb. 14, 2013

(30) Foreign Application Priority Data
Mar. 10, 2010 (JP) .................. 2010-053232

(51) Int. Cl.
*H01L 29/06* (2006.01)
*B82Y 10/00* (2011.01)
*H01L 51/05* (2006.01)
*H01L 51/00* (2006.01)

(52) U.S. Cl.
CPC ............ B82Y 10/00 (2013.01); H01L 51/0558 (2013.01); H01L 51/052 (2013.01); *H01L 51/0048* (2013.01); *H01L 51/0545* (2013.01)
USPC .................. 257/29; 257/E51.04; 438/478

(58) Field of Classification Search
CPC .. B82Y 10/00; H01L 51/052; H01L 51/0558; H01L 51/0545; H01L 51/0048; H01L 51/057; H01L 51/0045

USPC .............. 438/478; 257/29, E29.255, E21.09, 257/E51.04
See application file for complete search history.

(56) References Cited

FOREIGN PATENT DOCUMENTS

| JP | 2004-71654 A | 3/2004 |
|---|---|---|
| JP | 2006-19659 A | 1/2006 |
| JP | 2008-235880 A | 10/2008 |
| WO | 2005/008784 A1 | 1/2005 |
| WO | 2007/129643 A1 | 11/2007 |

OTHER PUBLICATIONS

Ryozo Takatsuka et al., Structure and Properties of Poly (2,5-dimethylterephthalamides), Journal of Polymer Science, 1978, pp. 361-370, vol. 16, Polymer Chemistry Edition.
Saner J. Tans et al., "Room-Temperature Transistor Based on a Single Carbon Nanotube", Letter to Nature, May 1998, pp. 49-52, vol. 393.
R. Martel et al., "Single- and Multi-Wall Carbon Nanotube Field-Effect Transistors", Applied Physics Letters, Oct. 26, 1998, pp. 2447-2449, vol. 73, No. 17.
S. J. Wind et al, "Vertical Scaling of Carbon Nanotube Field-Effect Transistors Using Top Gate Electrodes", Applied Physics Letters, May 20, 2002, pp. 3817-3819, vol. 80, No. 20.

(Continued)

*Primary Examiner* — Shaun Campbell
(74) *Attorney, Agent, or Firm* — Sughrue Mion, PLLC (57) ABSTRACT

A field-effect transistor includes a semiconductor layer containing carbon nanomaterials; a first electrode and a second electrode formed in contact with the semiconductor layer; a third electrode for controlling current flowing between the first electrode and the second electrode; and an insulating layer formed between the semiconductor layer and the third electrode. The insulating layer contains an aromatic polyamide comprising a substituent containing 1 to 20 carbon atoms.

19 Claims, 4 Drawing Sheets

(56) References Cited

OTHER PUBLICATIONS

Kai Xiao et al., "High-Mobility Thin-Film Transistors based on Aligned Carbon Nanotubes", Applied Physics Letters, Jul. 7, 2003, pp. 150-152, vol. 83, No. 1.

S. Kumar et al., "Performance of Carbon Nanotube-Dispersed Thin-Film Transistors", Applied Physics Letters, 2006, pp. 143501, vol. 89.

Neerja Saran et al., "Fabrication and Characterization of Thin Films of Single-Walled Carbon Nanotube Bundles on Flexible Plastic Substrates", J. Am. Chem. Soc., 2004, pp. 4462-4463, vol. 126, No. 14.

Zhuangchun Wu et al., "Transparent, Conductive Carbon Nanotube Films", Science, Aug. 27, 2004, pp. 1273-1276, vol. 305.

Mei Zhang et al., "Strong, Transparent, Multifunctional, Carbon Nanotube Sheets", Science, Aug. 19, 2005, pp. 1215-1219, vol. 309.

Yangxin Zhou et al., "A Method of Printing Carbon Nanotube Thin Films", Applied Physics Letters, 2006, vol. 88.

FIELD-EFFECT TRANSISTOR AND METHOD FOR MANUFACTURING THE SAME

CROSS-REFERENCE TO RELATED APPLICATIONS

This application is a National Stage of International Application No. PCT/JP2011/055495 filed on Mar. 9, 2011, which claims the benefit of the priority of Japanese patent application No. 2010-053232, filed on Mar. 10, 2010, the contents of all of which are incorporated herein by reference in their entirety.

TECHNICAL FIELD

The present disclosure relates to a field-effect transistor including a carbon nanomaterial in a semiconductor layer and a method manufacturing the same.

BACKGROUND

In recent years, a thin-film transistor has been developed, in which a carbon nanomaterial such as a carbon nanotube is used in a semiconductor layer (see Patent Literature 1 and Patent Literature 2, for example).

The carbon nanotube has a structure in which a graphene sheet is rolled up in a cylinder shape and generally has a straw shape. The carbon nanotube is classified into a single-walled carbon nanotube (SWCNT) formed of a single tube, a double-walled carbon nanotube (DWCNT) in which two carbon nanotubes which have different diameters are laminated, and a multi-walled carbon nanotube (MWCNT) in which a large number of tubes which have different diameters are laminated, and applied researches have been developed so as to bring out their characteristics of each structure. In the SWCNT, for example, there is a structure that exhibits semiconductor characteristics due to rolling up manner of the graphene sheet, high mobility is expected, and thus the researches on the SWCHT are energetically carried out for an application to a thin film transistor (TFT) (see Non-Patent Literatures 1-4, for example). Non-Patent Literature 3 reports that the TFT using the carbon nanotube has a high property equal to or greater than silicon. Since the DWCNT and MWCNT show high electrical conductivity, the researches on them are carried out for applications to an electrode material, conductive material for wiring, antistatic film and transparent electrode.

When the carbon nanotube or mixture of the carbon nanotubes is used as a semiconductor material, one carbon nanotube, several carbon nanotubes or a large number of carbon nanotubes are dispersed to make the TFT (see Patent Literature 3, for example). When a small number of the carbon nanotubes are used, since many of the carbon nanotubes generally have a length of about 1 μm or less, producing the TFT needs micromachining, and it is necessary to make a channel length between a source electrode and a drain electrode on a submicron scale. According to Patent Literature 3, for example, a method of manufacturing a carbon nanotube semiconductor device comprises: dropping a solution containing a carbon nanotube with conductor property and a carbon nanotube with semiconductor property onto a first electrode, a second electrode, and a region between the first electrode and the second electrode overlapped with a third electrode through the insulating film while an alternating current voltage is applied between the first electrode and the second electrode which are located over an insulating film over a third electrode; controlling the carbon nanotubes in a predetermined alignment direction; and applying a direct current voltage between the first electrode and the second electrode to remove the carbon nanotube with conductor property, wherein the first electrode is connected with the second electrode through the carbon nanotube with semiconductor property in the carbon nanotube semiconductor device. A distance between the second electrode and the third electrode is 5 μm to 50 μm.

On the other hand, when a large number of the carbon nanotubes are used, since a network of the carbon nanotubes is used as a channel, the channel length can be made longer, and the TFT can be easily manufactured (see Non-Patent Literature 5, for example). In order to make the thin film by dispersing a large number of the carbon nanotubes, the thin film can be easily made (see Non-Patent Literatures 6-9, for example) if a solution or dispersion liquid of the carbon nanotubes is used.

In the TFT, flexibility can be given to the entire film by forming the thin film of the carbon nanotubes as the semiconductor layer on a resin substrate in a process using the solution or dispersion liquid. If an applying or printing process is applied, a manufacturing cost can be decreased.

In the TFT using the semiconductor layer including the carbon nanotubes, the efficiency, especially field-effect mobility, can be enhanced, the TFT can be operated at a higher speed than an organic TFT including no carbon nanotube, and thus the scope of an applied electronic device can be expanded greatly.

A field effect transistor described in Patent Literature 1 comprises: a semiconductor layer through which carriers injected from a source region travel toward a drain region, the semiconductor layer being formed from a composite material comprising an organic semiconductor material and nanotubes.

A method of producing a thin film transistor, described in Patent Literature 2, comprising: a gate electrode formation step that forms a gate electrode on a substrate; a gate insulating layer formation step that forms a gate insulating layer on the substrate in such a manner as to cover the gate electrode formed in the gate electrode formation step; a source/drain electrodes formation step that forms a source electrode and a drain electrode on the gate insulating layer; and a semiconductor layer formation step that applies an aqueous solution for semiconductor layer formation which is an aqueous solution comprising at least single wall carbon nanotubes and a surfactant between the source electrode and the drain electrode formed in the source/drain electrodes formation step by a coating process to form a semiconductor layer comprising the single wall carbon nanotube.

Patent Literature 1: WO2005/008784
Patent Literature 2: JPA2008-235880
Patent Literature 3: JPA2004-71654
Non-Patent Literature 1: S. J. Tans et al., Room-temperature transistor based on a single carbon nanotube, *NATURE*, (1998) vol. 393, p. 49
Non-Patent Literature 2: R. Martel et al., Single- and multi-wall carbon nanotube field-effect transistors, *Appl. Phys. Lett.*, (1998) vol. 73, No. 17, p. 2447
Non-Patent Literature 3: S. Wind et al., Vertical scaling of carbon nanotube field-effect transistors using top gate electrodes, *Appl. Phys. Lett.*, (2002) vol. 80, No. 20, p. 3817
Non-Patent Literature 4: K. Xiao et al., High-mobility thin-film transistors based on aligned carbon nanotubes, *Appl. Phys. Lett.*, (2003) vol. 83, No. 1, p. 150
Non-Patent Literature 5: S. Kumar et al., Performance of carbon nanotube-dispersed thin-film transistors, *Appl. Phys. Lett.*, (2006) vol. 89, p. 143501

Non-Patent Literature 6: N. Saran et al., Fabrication and Characterization of thin films of single-walled carbon nanotube bundles on flexible plastic substrates, *J. Am. Chem. Soc.*, (2004) vol. 126, p. 4462

Non-Patent Literature 7: Z. Wu et al., Transparent, conductive carbon nanotube films, *SCIENCE*, (2004) No. 305, p. 1273

Non-Patent Literature 8: M. Zhang et al., Strong, transparent, multifunctional, carbon nanotube sheets, *SCIENCE*, (2005) No. 309, p. 1215

Non-Patent Literature 9: Y. Zhou et al., A method of printing carbon nanotube thin films, *Appl. Phys. Lett.*, (2006) vol. 88, p. 123109

SUMMARY

The following analysis is given in view of the present disclosure.

There is a problem that a field-effect transistor using a carbon nanotube material has a large hysteresis and therefore is very hard to be used as an electronic device as it be. It is considered that influence of water is one of factors of the large hysteresis. The water component is picked up into an insulating layer not only during manufacturing but also after the manufacturing and during using, and therefore the hysteresis appears. In the thin film transistor described in Patent Literature 2, for example, polyimide resin is used as a gate insulating layer. The polyimide resin that has high water absorptive capacity and water permeability makes it greater the hysteresis of the field-effect transistor in which the carbon nanotube material is used. On the other hand, an inorganic material film that is used as the gate insulating layer can suppresses the water absorption and permeation, but can not be adopted to a flexible device. Combination of the resin film and inorganic material film can combine the suppression of the water absorption and permeability and the flexibility, but is of no practical use owing to a complicated manufacturing process and high cost.

There is also a problem in adhesion between the carbon nanotube and the insulating layer and, if a flexible substrate such as a plastic substrate is especially used as the insulting layer, there is also a problem in deterioration of electrical characteristics owing to decline of the adhesive property between the thin film including the carbon nanotubes and the insulating layer when the substrate is bent.

It is an object of the prevent disclosure to provide a field-effect transistor and manufacturing method thereof, in which the increase of the hysteresis is prevented and the adhesive property between the semiconductor layer and the insulating layer is kept to ensure the flexibility even if the carbon nanotube material is used in the semiconductor layer.

According to a first aspect, there is provided a field-effect transistor, comprising: a semiconductor layer including a carbon nanomaterial; a first electrode and second electrode formed in contact with the semiconductor layer; a third electrode to control current that flows between the first electrode and the second electrode; and an insulating layer formed between the semiconductor layer and the third electrode. The insulating layer includes a high molecular compound shown in Chem. 1 [Chemical Expression 1]. At least one of $R^1$ to $R^8$ in the high molecular compound is a substituent including 1 carbon atom to 20 carbon atoms, and the remaining substituent(s) is/are hydrogen.

According to a second aspect, there is provided a method of manufacturing a field-effect transistor, comprising: forming a third electrode; forming an insulating layer including a high molecular compound shown in Chem. 1; forming a first electrode and second electrode; and forming a semiconductor layer including a carbon nanomaterial. At least one of $R^1$ to $R^8$ in the high molecular compound is a substituent including 1 carbon atom to 20 carbon atoms, and the remaining substituent(s) is/are hydrogen.

[Chem. 1]

The disclosure has at least one of the following effects.

According to the disclosure, in the field-effect transistor in which the carbon nanomaterial is used in the semiconductor layer, the hysteresis can be suppressed. According to the disclosure, the flexibility of the field-effect transistor can be ensured by keeping the adhesion property between the semiconductor layer and the insulating layer.

PREFERRED MODES

Preferred modes of the first and second aspects are described below.

According to a preferred mode of the first aspect, at least one of $R^1$ to $R^4$ in the high molecular compound is a hydrocarbon group having 1 carbon atom to 20 carbon atoms. At least one of $R^5$ to $R^8$ in the high molecular compound is a hydrocarbon group having 1 carbon atom to 20 carbon atoms. The remaining substituent(s) of $R^1$ to $R^8$ in the high molecular compound is/are hydrogen.

According to a preferred mode of the first aspect, the high molecular compound has a molecular weight of 10,000 to 50,000.

According to a preferred mode of the first aspect, the first electrode and the second electrode are formed on the insulating layer. The semiconductor layer is formed at least between the first electrode and the second electrode on the insulating layer.

According to a preferred mode of the first aspect, the semiconductor layer is formed on the insulating layer. The first electrode and the second electrode are formed on the semiconductor layer.

According to a preferred mode of the first aspect, one electrode of the first electrode and the second electrode is formed on the insulating layer. The semiconductor layer is formed on the insulating layer so as to cover the one electrode. The other electrode of the first electrode and the second electrode is formed on the semiconductor layer.

According to a preferred mode of the first aspect, at least one of $R^1$ to $R^8$ in the high molecular compound is an alkyl group having 6 to 8 carbon atoms. The remaining substituent(s) is/are hydrogen.

According to a preferred mode of the second aspect, the insulating layer is formed by applying a solution including the high molecular compound.

According to a preferred mode of the second aspect, the semiconductor layer is formed by applying a dispersion liquid of the carbon nanomaterial.

Figure 1:
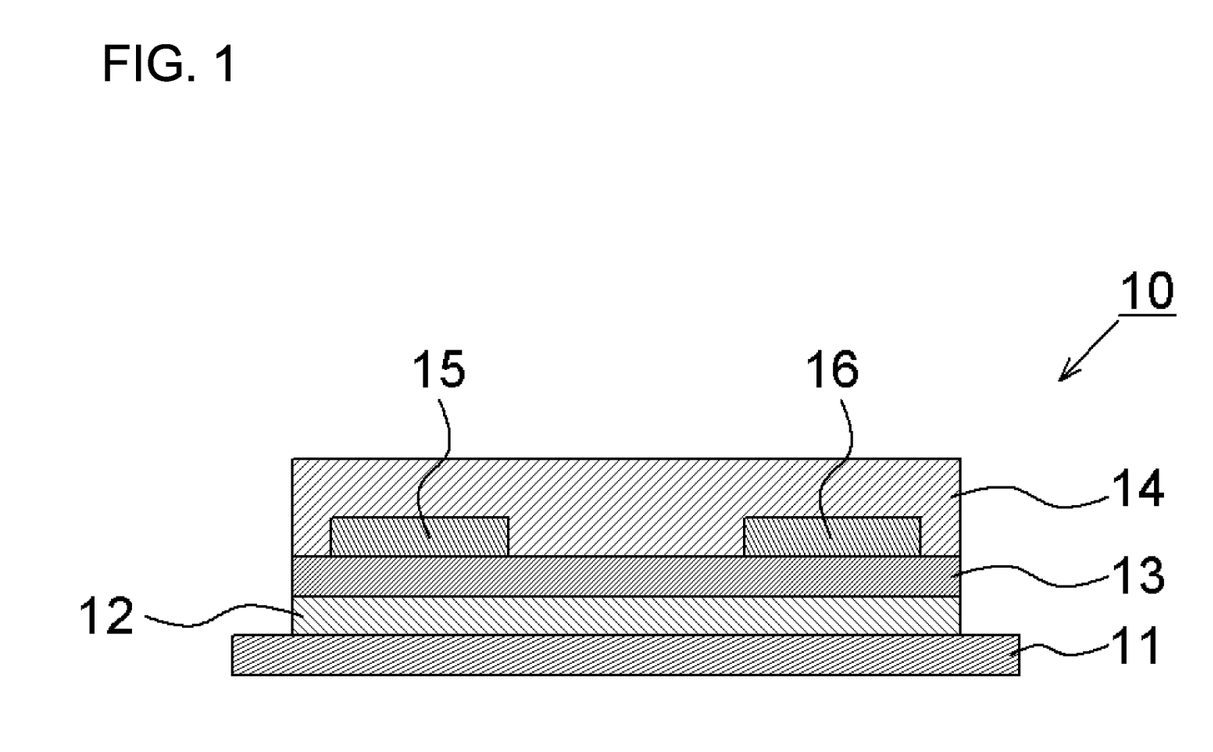
FIG. 1 is a schematic diagram of a cross-section of a field-effect transistor according to a first exemplary embodiment of the disclosure.

A field-effect transistor according to a first exemplary embodiment of the disclosure and a manufacturing method thereof will be explained. FIG. 1 illustrates a schematic cross section of the field-effect transistor according to the first exemplary embodiment of the disclosure. The field-effect transistor illustrated in FIG. 1 is a thin-film transistor.

The field-effect transistor 10 comprises a substrate 11, a third electrode 12 formed on the substrate 11, an insulating layer 13 formed on the third electrode 12, a first electrode 15 and second electrode 16 formed on the insulating layer 13, and a semiconductor layer 14 formed on the insulating layer 13 so as to cover the first electrode 15 and second electrode 16. The first electrode 15 and second electrode 16 function as a source electrode and drain electrode. The third electrode 12 functions as a gate electrode. Current that flows between the first electrode 15 and the second electrode 16 is controlled by applying voltage to the third electrode 12.

The semiconductor layer 14 includes a carbon nanomaterial. The carbon nanomaterial preferably accounts for 95 wt % or more of the semiconductor layer 14. As the carbon nanomaterial, a single-walled carbon nanotube (SWCNT) may be used. As far as semiconductor characteristics are exhibited, a double-walled carbon nanotube (DWCNT), multi-walled carbon nanotube (MWCNT) and carbon nanohorn may be used as the carbon nanomaterial. Alternatively, a mixture of several carbon nanomaterials may be used. When the single-walled carbon nanotube is used, it is preferred that the single-walled carbon nanotube may have a diameter of 0.5 nm to 2 nm and more preferably 0.7 nm to 1.2 nm. It is also preferred that the single-walled carbon nanotube may have a length of 0.5 µm to 10 µm and more preferably 0.7 µm to 2 µm.

The semiconductor layer 14 may be a monomolecular film of the carbon nanomaterial (the carbon nanotube, for example). In the mode illustrated in FIG. 1, a part where the semiconductor layer 14 functions is a proximity of an interface between the semiconductor layer 14 and the insulating layer 13. In modes illustrated in FIGS. 2 and 3 below, it is preferred that the semiconductor layer 14 has a thickness of 500 nm or less because it will become hard to inject electric charges if the semiconductor layer 14 is too thick.

The semiconductor layer 14 may further comprise an organic semiconductor material. Inclusion of the organic semiconductor material contributes to enhance the semiconductor characteristics of the semiconductor layer 14. As the organic semiconductor material, poly(3-hexylthiophene) (P3HT), poly(9,9-dioctyl fluorene-co-bithiophene) (F8T2) and the like may be used. In this case, it is preferred that a content of the carbon nanomaterial is 1 wt % to 90 wt % and, more preferably, 20 wt % to 50 wt % in order not to damage adhesive property of resin and to develop high mobility of the carbon nanomaterial. The semiconductor layer 14 may further include an insulating resin. The insulating resin may function as a binder, for example. The semiconductor layer 14 may include both of the organic semiconductor material and the insulating resin.

A manufacturing method of the carbon nanomaterial is not limited to a particular method. As the method of manufacturing the carbon nanotube, a CVD method, laser ablation method and the like may be used.

The insulating layer 13 includes an aromatic polyamide (aramid) compound shown in Chem. 1 below. The insulating layer 13 is preferably formed of a high molecular compound illustrated in Chem. 1. In Chem. 1, $R^1$ to $R^8$ indicate hydrogen or a substituent containing carbon atom(s) (i.e., carbon-containing substituent).

By using an aromatic polyamide compound in the insulating layer 13, the hysteresis in the field-effect transistor can be suppressed. The term "hysteresis" in the disclosure means a difference in voltage of the third electrode between an upward path and a downward path in an intermediate drain current of the electric characteristics (current between a maximum value of the drain current and a minimum value of the drain current) when the voltage of the third electrode is swept while the voltage between the first electrode 15 and the second electrode 16 is fixed at a constant value.

In the high molecule shown in Chem. 1, because an amide bond is used for hydrogen bond between primary structures, polarization is held down to a small degree as a high molecular compound, and thus the water absorption and permeability are suppressed. Therefore, the water permeability of the high molecular compound shown in Chem. 1 is half or less as that of the polyimide resin, and thus use of the high molecular compound shown in Chem. 1 can greatly suppress the hysteresis.

(Chem. 1)

In the high molecular compound shown in Chem. 1, $R^1$ to $R^8$ indicate hydrogen or the carbon-containing substituent. By introduction of the carbon-containing substituent, solubility can be enhanced as compared with an unsubstituted compound, and the adhesive property to the semiconductor layer can be enhanced. It is preferred that at least one substituent of $R^1$ to $R^8$ is the substituent including 1 to 20 carbon atoms. It is further preferred that at least one substituent of $R^1$ to $R^4$ is the substituent including 1 to 20 carbon atoms and that at least one substituent of $R^5$ to $R^8$ is the substituent including 1 to 20 carbon atoms. It is preferred that the number of the carbon-containing substituent among $R^1$ to $R^4$ is 1 to 2, and that the number of the carbon-containing substituent among $R^5$ to $R^8$ is 1 to 2 because the greater the number of the carbon-containing substituent is, the greater the steric hindrance is, and thus there is a possibility that strength and dielectric property of the insulating layer 13 decrease. If a plurality of the carbon-containing substituents are introduced to $R^1$ to $R^8$, the substituents may be same or different. The position for the introduction of the carbon-containing substituent does not need to be specified. The high molecular compound may be a mixture including a plurality of compounds different in the position or the number of the introduction of the carbon-containing substituents.

It is preferred that $R^1$ to $R^8$ are a substituent without a polar functional group and, more preferably, a hydrocarbon group, especially an alkyl group, in order to enhance the binding (adhesive property) between the insulating layer 13 and the semiconductor layer 14. Since the carbon nanomaterial has nonpolar carbon-carbon bonding, the binding between the insulating layer 13 and the semiconductor layer 14 can be enhanced if $R^1$ to $R^8$ are nonpolar substituents. If the binding between the insulating layer 13 and the semiconductor layer 14 is enhanced, the deterioration of the electronic characteristics can be suppressed when the field-effect transistor 10 is bent. By introducing the hydrocarbon group into at least one of $R^1$ to $R^8$, the insulating layer 13 may be formed by applying or printing a solution because solubility to a solvent can be enhanced, keeping the strength and inflexibility of the aromatic polyamide. The high molecular compound shown in Chem. 1 is dissolved into a solvent to make a solution, and the insulating layer 13 can be formed by a screen printing or ink-jet printing, for example. The insulating layer 13 formed by such methods has an outstanding insulation (dielectric) property.

It is preferred that the number of carbon in each of $R^1$ to $R^8$ is determined based on adhesiveness to the semiconductor layer 14 including the carbon nanomaterial and the solubility. Because the less the number of carbon becomes, the less the solubility to the solvent becomes, formation of a thin film of the insulating layer 13 becomes difficult and the binding (adhesiveness) to the semiconductor layer 14 decreases. Therefore, it is preferred that the number of carbon in each of $R^1$ to $R^8$ is 1 or more. On the other hand, because the greater the number of carbon becomes, the greater the steric hindrance becomes in the insulating layer 13, although the strength and dielectric property of the insulating layer 13 decrease, the adhesiveness to the semiconductor layer 14 is enhanced, and the bending characteristic is improved. Therefore, it is preferred that the number of carbon in each of $R^1$ to $R^8$ is 20 or less. It is further preferred that $R^1$ to $R^8$ are a hydrocarbon group having 6 to 10 carbon atoms and, more preferably, a hydrocarbon group having 6 to 8 carbon atoms in view of facility of the formation of the thin film and the adhesiveness.

The degree n of polymerization of the high molecular compound shown in Chem. 1 is determined so as to attain enough solubility to the solvent to form the insulating layer 13 of the thin film. It is preferred that the high molecular compound shown in Chem. 1 has the molecular weight of 10,000 to 50,000, for example. It is preferred that the degree of polymerization n is 40 to 200. If the molecular weight or the degree of polymerization is too low, the solubility to the solvent becomes too high. There is a possibility that the solvent erodes the insulating layer 13 in a later process. On the other hand, if the molecular weight or the degree of polymerization is too high, there is a possibility that the solubility to the solvent becomes too low, offering a difficulty in forming the insulating layer.

The method for manufacturing the high molecular compound shown in Chem. 1 is not limited to a particular method. The high molecular compound shown in Chem. 1 is synthesized by polymerization reaction of 1,4-benzen-dicarboxylic acid having the substituents $R^1$ to $R^4$ with 1,4-diaminobenzen having the substituents $R^5$ to $R^8$, for example.

It is preferred that the insulating layer 13 has a thickness of 50 nm to 1 µm. If the insulating layer 13 has a thickness less than 50 nm, the insulation (dielectric) property is lowered, leakage current occurs between the third electrode 12 and the first and second electrodes 15, 16, and therefore there is a possibility that the device fails to function. If the insulating layer 13 has a thickness greater than 1 µm, a gate voltage becomes too high. If the device is operated at several volts to several tens volts, it is preferred that the insulating layer 13 has a thickness of 500 nm or less and more preferably 100 nm to 300 nm.

A material usable for the substrate 11 is not limited to a particular material if the field-effect transistor can be supported, and an inorganic material such as glass, silicon and the like and an organic material such as acrylic resin and the like may be used. The substrate may be dispensed with if the field-effect transistor can be supported otherwise.

A method of forming the semiconductor layer 14 may use a wet process or dry process as far as the thin film can be formed uniformly. In a case where a uniform thin film of the single-walled carbon nanotube is formed, it is preferred that the wet process is used. In the case where the semiconductor layer 14 is formed by the wet process, the semiconductor layer 14 can be formed by preparing an ink including the carbon nanotube and applying or printing the ink. It is preferred that the content of the carbon nanotube in the carbon nanotube ink is 1% to 10% in view of viscosity and consistency.

As a material usable for the first electrode 15, second electrode 16 and third electrode 12, a conductor of a metal-based type, such as indium-tin oxide (ITO), tin oxide (NESA glass), gold, silver, platinum, copper, indium, aluminum, magnesium, magnesium-indium alloy, magnesium-aluminum alloy, aluminum-lithium alloy, aluminum-scandium-lithium alloy, magnesium-silver alloy and the like; and a conductor of an organic material type such as an electroconductive polymer and the like are given, but not limited thereto.

The first electrode 15, second electrode 16 and third electrode 12 may be formed by an ordinary electrode formation process, such as a vacuum deposition method, sputtering method, etching method, liftoff method and the like. In the case where the electrode is formed with the organic material such as the electroconductive polymer, a solution process such as a spin coating method, dipping method and the like may be also used.

The field-effect transistor 10 according to the first exemplary embodiment may be produced by the following process, for example. First, a third electrode 12 is formed on the substrate 11. Next, a high molecular compound shown in Chem. 1 is dissolved in water or organic solvent to prepare a solution, and the solution is applied or printed on the third electrode 12 to form a thin film of an insulating layer 13. Next, a first electrode 15 and second electrode 16 are formed on an insulating layer 13 at a predetermined interval. Next, a dispersion liquid in which the carbon nanomaterial is dispersed in water or organic solvent is applied on the insulating layer 13, first electrode 15 and second electrode 16 to form a semiconductor layer 14.

Figure 2:
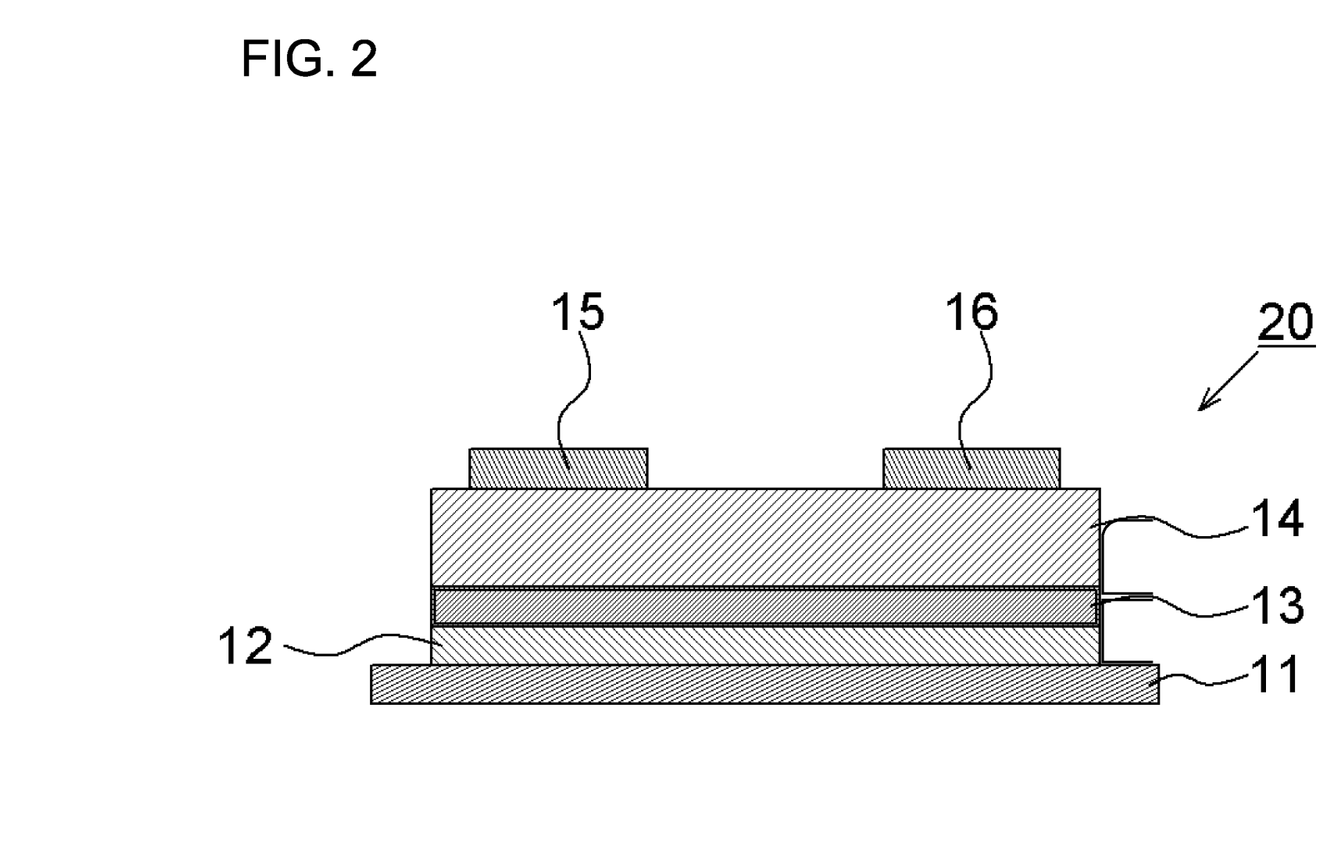
FIG. 2 is a schematic diagram of a cross-section of a field-effect transistor according to a second exemplary embodiment of the disclosure.

Next, a field-effect transistor according to a second exemplary embodiment of the disclosure will be explained. FIG. 2 illustrates a schematic cross section of the field-effect transistor according to the second exemplary embodiment of the disclosure. The field-effect transistor illustrated in FIG. 2 is a thin film transistor. In FIG. 2, reference signs same as those in FIG. 1 are given to elements same as those illustrated in FIG. 1.

In the field-effect transistor 10 according to the first exemplary embodiment, the first electrode 15 and second electrode 16 are formed on the insulating layer 13 and are covered with the semiconductor layer 14, whereas, in the field-effect transistor 20 according to the second exemplary embodiment, the first electrode 15 and second electrode 16 are formed not on the insulating layer 13 but on the semiconductor layer 14. The other modes are same as the first exemplary embodiment.

Figure 3:
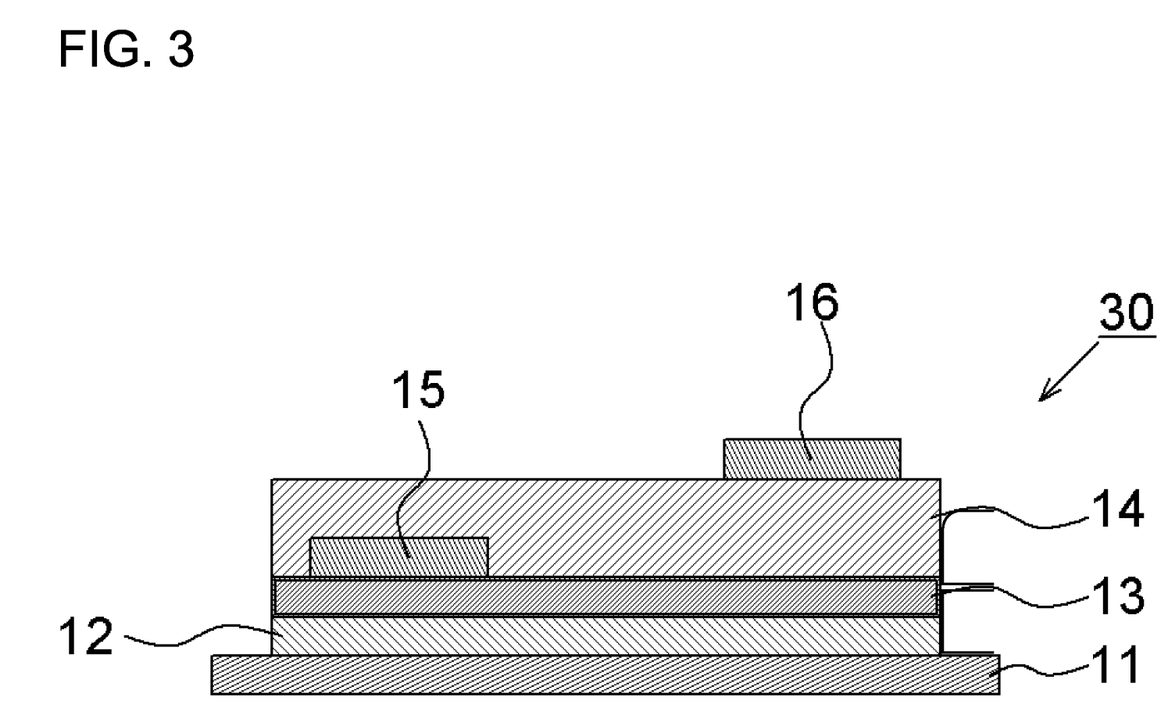
FIG. 3 is a schematic diagram of a cross-section of a field-effect transistor according to a third exemplary embodiment of the disclosure.

Next, a field-effect transistor according to a third exemplary embodiment of the disclosure will be explained. FIG. 3 illustrates a schematic cross section of the field-effect transistor according to the third exemplary embodiment of the disclosure. The field-effect transistor illustrated in FIG. 3 is a thin film transistor. In FIG. 3, reference signs same as those in FIG. 1 are given to elements same as those illustrated in FIG. 1.

In the field-effect transistor 30 according to the third exemplary embodiment, one electrode of the first electrode 15 and second electrode 16 (in the mode illustrated in FIG. 3, the first electrode 15) is formed on the insulating layer 13, and the other electrode (in the mode illustrated in FIG. 3, the second electrode 16) is formed on the semiconductor layer 14. The other modes are same as the first exemplary embodiment.

EXAMPLES

Synthesis of High Molecular Compound Shown in Chem. 1

The high molecular compound shown in Chem. 1 was synthesized. First, 2.5 g of 2-hexyl-1,4-benzen-dicarboxylic acid was dissolved in 100 ml of chloroform and mixed at a room temperature. Next, 2.5 g of thionyl chloride was dissolved in 20 ml of chloroform to prepare a solution, and drops of this solution were dripped into a 2-hexyl-1,4-benzen-dicarboxylic acid solution over 30 minutes and mixed for 1 hours. Next, 1.9 g of 2-hexyl-1,4-diaminobenzen was dissolved in 50 ml of chloroform, and drops of this solution were dripped into the 2-hexyl-1,4-benzen-dicarboxylic acid solution over 1 hours. After dripping, the resultant solution was mixed for 2 hours, and the reaction was stopped by adding water. Hydrogen chloride produced by the reaction was removed with a potassium hydroxide aqueous solution, the product was washed with water to complete synthesis of the high molecular compound shown in Chem. 1.
[Formation of Field-Effect Transistor]

A carbon nanotube thin-film transistor in which the semiconductor layer is formed of the carbon nanotube was made. The field-effect transistor according to the first exemplary embodiment illustrated in FIG. 1 is explained herein. First, a film of chromium having a thickness of 100 nm was formed on a polyimide substrate by the vacuum deposition method to form the third electrode (gate electrode). A film of the high molecular compound, synthesized by the above method, having a thickness of 300 nm was formed on the third electrode by the spin coating method (2000 rpm, 60 seconds) using a 1.5 wt % chloroform solution of the high molecular compound to form an insulating layer. Next, a film of magnesium-silver alloy having a thickness of 100 nm was formed on the insulating layer in a stripe manner using a metal mask to form the first electrode and second electrode (source electrode and drain electrode). Next, carbon nanotubes (made by CNI Corporation, purified grade) were mixed in dichloroethane at 5 ppm and monodispersed [into primary particles] with treatment of an ultrasonic device for 1 hour, and carbon nanotube ink was prepared, in which impurities such as metal were removed with treatment of an ultracentrifuge device for 20 minutes. A film of the carbon nanotube ink was formed on the insulating layer by the spin coating method (2000 rpm, 60 seconds) to manufacture the carbon nanotube thin-film transistor.
[Measurement of Hysteresis Characteristics]

Figure 4:
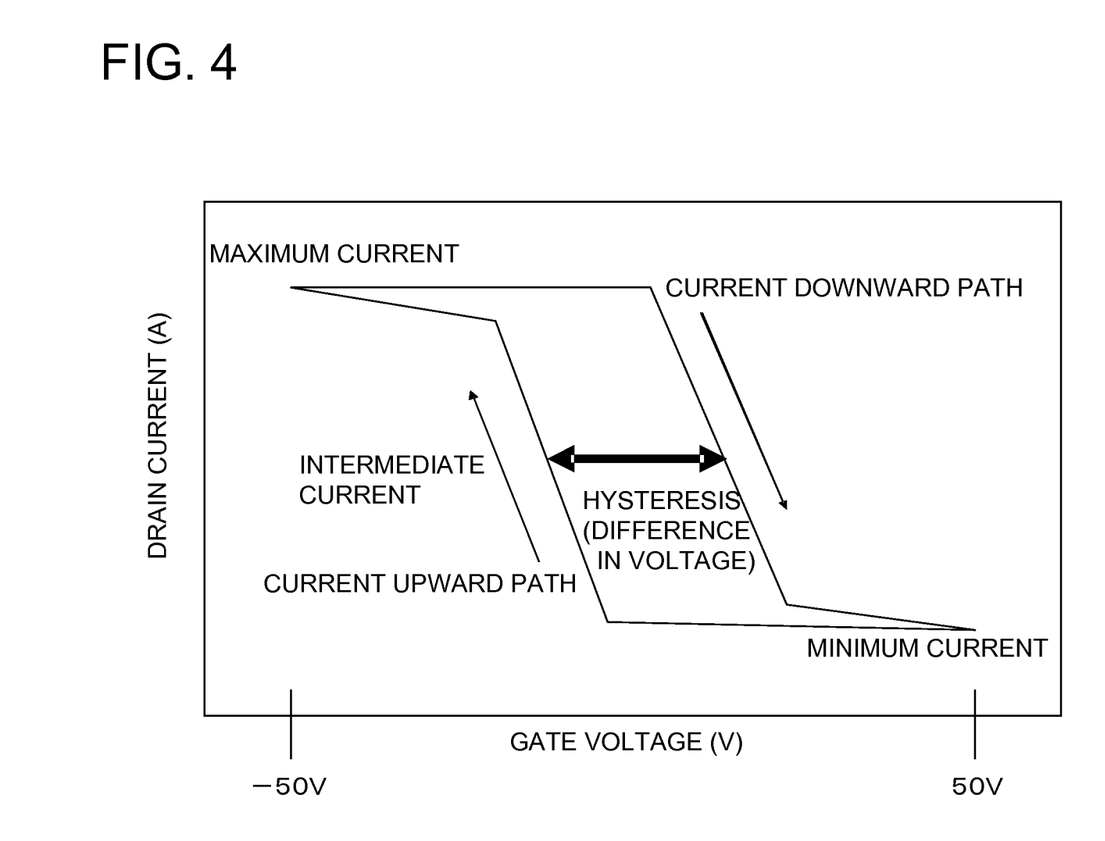
FIG. 4 is a schematic diagram to explain a hysteresis in an example.

Hysteresis was measured on the formed carbon nanotube thin-film transistor. FIG. 4 illustrates a schematic diagram to explain the hysteresis. The hysteresis was the difference between voltage of an upward path (trace) and voltage of a downward path (trace) during an intermediate current between the maximum current value and the minimum current value in the electric characteristics when the electric characteristics were measured applying a voltage of 2V between the source and the drain, sweeping from −50V to +50V of voltage (per 1V step) (in the upward path) on the gate electrode, and on the contrary sweeping from +50V to −50V of voltage (in the downward path).

In the same way, on each structure according to the first to third exemplary embodiments, the hysteresis was measured changing substituents of the high molecular compound shown in Chem. 1. Each result was shown in the following table as Examples 1 to 10. As Comparative example 1, a carbon nanotube thin-film transistor was manufactured, in which a polyimide compound (made by Kyocera Chemical, Chemitite) was used instead of the high molecular compound shown in Chem. 1, and the hysteresis was measured in the same way.

In Table 1, the structure "FIG. 1" indicates the structure of the field-effect transistor 10 according to the first exemplary embodiment illustrated in FIG. 1, the structure "FIG. 2" indicates the structure of the field-effect transistor 20 according to the second exemplary embodiment illustrated in FIG. 2, and the structure "FIG. 3" indicates the structure of the field-effect transistor 30 according to the third exemplary embodiment illustrated in FIG. 3. The item "Number" indicates the number of the "Substituent" shown in the Table.

TABLE 1

| | Structure | $R^1$~$R^8$ Substituent | Number | $R^5$~$R^8$ Substituent | Number | Hysteresis value/V |
|---|---|---|---|---|---|---|
| Example 1 | FIG. 1 | n-$C_6H_{13}$ | 1 | n-$C_6H_{13}$ | 1 | 0.7 |
| Example 2 | FIG. 1 | n-$C_6H_{13}$ | 1 | n-$C_6H_{13}$ | 2 | 0.8 |
| Example 3 | FIG. 1 | n-$C_6H_{13}$ | 2 | n-$C_6H_{13}$ | 1 | 0.5 |
| Example 4 | FIG. 2 | n-$C_8H_{17}$ | 1 | n-$C_8H_{17}$ | 1 | 1.0 |
| Example 5 | FIG. 1 | n-$C_8H_{17}$ | 1 | n-$C_8H_{17}$ | 2 | 0.9 |
| Example 6 | FIG. 1 | n-$C_8H_{17}$ | 2 | n-$C_8H_{17}$ | 1 | 0.2 |
| Example 7 | FIG. 3 | n-$C_6H_{13}$ | 1 | n-$C_8H_{17}$ | 1 | 0.6 |
| Example 8 | FIG. 2 | n-$C_6H_{13}$ | 2 | n-$C_8H_{17}$ | 1 | 0.4 |
| Example 9 | FIG. 1 | n-$C_8H_{17}$ | 1 | n-$C_6H_{13}$ | 1 | 0.9 |
| Example 10 | FIG. 1 | n-$C_8H_{17}$ | 1 | n-$C_6H_{13}$ | 1 | 0.3 |
| Comparative example 1 | FIG. 1 | n-$C_6H_{13}$ | 1 | n-$C_6H_{13}$ | 1 | 2.5 |

According to Examples 1 to 10, the hysteresis values were 1.0 or less, whereas, according to Comparative example 1, the hysteresis value was 2.5. Therefore according to the disclosure, it is found that, by using the aramid compound shown in Chem. 1 in the insulating layer, the hysteresis can be suppressed as compared with the thin-film transistor using polyimide.
[Measurement of Flexible Resistance]

On the thin-film transistor according to Example 1 and the thin-film transistor according to Comparative Example 1, the flexible resistances were compared. In a test method, a motion that each thin-film transistor was folded double (into 2-folds) so that an arc formed by a curved surface of the thin-film transistor was shaped to an arc of a circle having 10 mm of a diameter followed by restoration to the original shape was repeated 1000 times. Then, the electric characteristics were measured in the same way as above, and the maximum current value before application of the folding-bending was compared with that after application of the folding-bending.

As a result, in the thin-film transistor according to Example 1, the maximum current value after the folding-bending application was 98% of the maximum current value before the folding-bending application, and large attenuation of the maximum current value by the folding-bending application did not appear. On the other hand, in the thin-film transistor according to Comparative example 1, the maximum current value after the folding-bending application, which was 80% of the maximum current value before the folding-bending application, was attenuated greater than Example 1. Thus, according to the disclosure, by using the aramid compound shown in Chem. 1 in the insulating layer, the flexible resistance can be improved as compared with the thin-film transistor using polyimide. This reason is considered that the binding (adhesiveness) between the semiconductor layer and insulating layer is improved.

The field-effect transistor and manufacturing method thereof of the present disclosure are explained based on the above exemplary embodiments and examples, but are not limited to the above exemplary embodiments and examples, and may include any modification, change and improvement to the exemplary embodiments and examples within the scope of the present disclosure and based on the basic technical concept of the present disclosure. Within the scope of the claims of the present disclosure, various combinations, substitutions and selections of disclosed elements are available.

A further problem, object and exemplary embodiment of the present disclosure become clear from the entire disclosure of the present invention including claims and drawings.

Each disclosure of the above patent literatures and non-patent literatures is incorporated herein in its entirety by reference thereto. Within the scope of the entire disclosure (including claims) and based on the basic technical idea of the present disclosure, modification and adjustment of the exemplary embodiments and examples are available. Within the scope of the claims of the present disclosure, various combinations and selections of disclosed elements are available. That is, it is understood that the disclosure includes modifications and correction which a person skilled in the art could make based on the technical idea. Particularly, any numerical range disclosed herein should be interpreted that any intermediate values or subranges falling within the disclosed range are also concretely disclosed even without specific recital thereof.

The disclosure may be suitably applied to an electronic device that requires the flexible thin-film transistor, for example.

REFERENCE SIGNS LIST

10, 20, 30 Field-effect transistor
11 Substrate
12 Third electrode
13 Insulating layer
14 Semiconductor layer
15 First electrode
16 Second electrode

What is claimed is:
1. A field-effect transistor, comprising:
 a semiconductor layer including a carbon nanomaterial;
 a first electrode and second electrode formed in contact with said semiconductor layer;
 a third electrode to control current that flows between said first electrode and said second electrode; and
 an insulating layer formed between said semiconductor layer and said third electrode; wherein
 said insulating layer includes a high molecular compound shown in Chem. 1; and
 at least one of $R^1$ to $R^8$ in said high molecular compound is a substituent including 1 carbon atom to 20 carbon atoms, and the remaining substituent(s) is/are hydrogen

[Chem. 1]

2. The field-effect transistor according to claim 1, wherein
 at least one of $R^1$ to $R^4$ in said high molecular compound is a hydrocarbon group having 1 carbon atom to 20 carbon atoms;
 at least one of $R^5$ to $R^8$ in said high molecular compound is a hydrocarbon group having 1 carbon atom to 20 carbon atoms; and
 the remaining substituent(s) of $R^1$ to $R^8$ in said high molecular compound is/are hydrogen.
3. The field-effect transistor according to claim 1, wherein said high molecular compound has a molecular weight of 10,000 to 50,000.
4. The field-effect transistor according to claim 1, wherein
 said first electrode and said second electrode are formed on said insulating layer; and
 said semiconductor layer is formed at least between said first electrode and said second electrode on said insulating layer.
5. The field-effect transistor according to claim 1, wherein
 said semiconductor layer is formed on said insulating layer; and
 said first electrode and said second electrode are formed on said semiconductor layer.
6. The field-effect transistor according to claim 1, wherein
 one electrode of said first electrode and said second electrode is formed on said insulating layer;
 said semiconductor layer is formed on said insulating layer so as to cover said one electrode; and
 the other electrode of said first electrode and said second electrode is formed on said semiconductor layer.
7. The field-effect transistor according to claim 1, wherein
 at least one of $R^1$ to $R^8$ in said high molecular compound is an alkyl group having 6 to 8 carbon atoms; and
 the remaining substituent(s) is/are hydrogen.
8. A method of manufacturing a field-effect transistor, comprising:
 forming a third electrode;
 forming an insulating layer including a high molecular compound shown in Chem. 2;
 forming a first electrode and second electrode; and
 forming a semiconductor layer including a carbon nanomaterial; wherein
 at least one of $R^1$ to $R^8$ in said high molecular compound is a substituent including 1 carbon atom to 20 carbon atoms, and the remaining substituent(s) is/are hydrogen

[Chem. 2]

9. The method of manufacturing a field-effect transistor according to claim 8, wherein
 said insulating layer is formed by applying a solution including said high molecular compound.

10. The method of manufacturing a field-effect transistor according to claim 8, wherein
said semiconductor layer is formed by applying a dispersion liquid of said carbon nanomaterial.

11. The method of manufacturing a field-effect transistor according to claim 9, wherein
said semiconductor layer is formed by applying a dispersion liquid of said carbon nanomaterial.

12. A field-effect transistor, comprising:
a semiconductor layer including a carbon nanomaterial;
a first electrode and second electrode formed in contact with said semiconductor layer;
a third electrode to control current that flows between said first electrode and said second electrode; and
an insulating layer formed between said semiconductor layer and said third electrode; wherein
said insulating layer includes a high molecular compound shown in Chem. 2;
at least one of $R^1$ to $R^4$ in said high molecular compound is a hydrocarbon group having 1 carbon atom to 20 carbon atoms;
at least one of $R^5$ to $R^8$ in said high molecular compound is a hydrocarbon group having 1 carbon atom to 20 carbon atoms;
the remaining substituent(s) of $R^1$ to $R^8$ in said high molecular compound is/are hydrogen; and
said high molecular compound has a molecular weight of 10,000 to 50,000

[Chem. 2]

13. The field-effect transistor according to claim 12, wherein
said first electrode and said second electrode are formed on said insulating layer; and
said semiconductor layer is formed at least between said first electrode and said second electrode on said insulating layer.

14. The field-effect transistor according to claim 12, wherein
said semiconductor layer is formed on said insulating layer; and
said first electrode and said second electrode are formed on said semiconductor layer.

15. The field-effect transistor according to claim 12, wherein
one electrode of said first electrode and said second electrode is formed on said insulating layer;
said semiconductor layer is formed on said insulating layer so as to cover said one electrode; and
the other electrode of said first electrode and said second electrode is formed on said semiconductor layer.

16. The field-effect transistor according to claim 12, wherein
at least one of $R^1$ to $R^8$ in said high molecular compound is an alkyl group having 6 to 8 carbon atoms; and
the remaining substituent(s) is/are hydrogen.

17. The field-effect transistor according to claim 13, wherein
at least one of $R^1$ to $R^8$ in said high molecular compound is an alkyl group having 6 to 8 carbon atoms; and
the remaining substituent(s) is/are hydrogen.

18. The field-effect transistor according to claim 14, wherein
at least one of $R^1$ to $R^8$ in said high molecular compound is an alkyl group having 6 to 8 carbon atoms; and
the remaining substituent(s) is/are hydrogen.

19. The field-effect transistor according to claim 15, wherein
at least one of $R^1$ to $R^8$ in said high molecular compound is an alkyl group having 6 to 8 carbon atoms; and
the remaining substituent(s) is/are hydrogen.

* * * * *